United States Patent [19]

Collins et al.

[11] Patent Number: 5,547,812
[45] Date of Patent: Aug. 20, 1996

[54] COMPOSITION FOR ELIMINATING MICROBRIDGING IN CHEMICALLY AMPLIFIED PHOTORESISTS COMPRISING A POLYMER BLEND OF A POLY(HYDROXYSTYRENE) AND A COPOLYMER MADE OF HYDROXYSTYRENE AND AN ACRYLIC MONOMER

[75] Inventors: James P. Collins, Chittenden County, Vt.; Judy Dorn, Dutchess County, N.Y.; James T. Fahey, Middlesex County, Mass.; Leo Linehan, Orange County, N.Y.; William J. Miller, Chittenden County, Vt.; Wayne Moreau, Dutchess County, N.Y.; Erik A. Puttlitz, Chittenden County, Vt.; Randolph Smith, Orange County; Gary Spinillo, Dutchess County, both of N.Y.

[73] Assignee: International Business Machines Corporation, Armonk, N.Y.

[21] Appl. No.: 464,229

[22] Filed: Jun. 5, 1995

[51] Int. Cl.$^6$ ...................................... G03F 7/038
[52] U.S. Cl. .................. 430/270.1; 430/325; 430/909; 430/910
[58] Field of Search .................. 430/330, 191, 430/270.1, 909, 910, 325; 522/31

[56] References Cited

U.S. PATENT DOCUMENTS

| | | | |
|---|---|---|---|
| 4,439,516 | 3/1984 | Cernigliaro et al. | 430/270.1 |
| 4,600,683 | 7/1986 | Greco et al. | 430/270 |
| 4,612,270 | 9/1986 | Pampalone et al. | 430/273 |
| 4,931,381 | 6/1990 | Spak et al. | 430/325 |
| 4,963,463 | 10/1990 | Koshiba et al. | 430/191 |
| 5,008,175 | 4/1991 | Hsieh et al. | 430/191 |
| 5,034,304 | 7/1991 | Feely et al. | 430/270.1 |
| 5,210,000 | 5/1993 | Thackeray et al. | 430/165 |
| 5,252,435 | 10/1993 | Tani et al. | 430/325 |
| 5,258,257 | 11/1993 | Sinta et al. | 430/192 |
| 5,352,564 | 10/1994 | Takeda et al. | 430/270 |
| 5,376,498 | 12/1994 | Kajita et al. | 430/191 |
| 5,399,456 | 3/1995 | Spak et al. | 430/272 |

FOREIGN PATENT DOCUMENTS

0605089A2 7/1994 European Pat. Off. .

*Primary Examiner*—John S. Y. Chu
*Attorney, Agent, or Firm*—Whitham, Curtis, Whitham & McGinn; Steven J. Soucar, Esq.

[57] ABSTRACT

Microbridge formation in chemically amplified negative tone photoresists based on poly(hydroxystyrene) (PHS) is avoided when the PHS is blended together with a co-polymer of PHS and an acrylic polymer such as poly(methyl methacrylate) (PMMA). The blend should include at least 10% by weight of the co-polymer. In operation, hydrogen bonding between the hydroxystyrene sub-units and the methacrylate sub-units decreases the availability of sites for crosslinking, and this reduction in crosslinking sites makes the blend less susceptible to formation of polymer resist microbridges. The invention is practicable with a polymers having a wide range of molecular weights (2000-50000 daltons), and development can be achieved using the industry standard 2.38 wt % trimethylammonium hydroxide (TMAH) developer without any adverse impact on the photoresist.

17 Claims, No Drawings

COMPOSITION FOR ELIMINATING
MICROBRIDGING IN CHEMICALLY
AMPLIFIED PHOTORESISTS COMPRISING
A POLYMER BLEND OF A
POLY(HYDROXYSTYRENE) AND A
COPOLYMER MADE OF
HYDROXYSTYRENE AND AN ACRYLIC
MONOMER

BACKGROUND OF THE INVENTION

1. Field of the Invention

The present invention generally relates to chemically amplified negative tone photoresists based on poly(hydroxystyrene) (PHS) and, more particularly, to compositions and methods for allowing sub-micron patterns to be reliably made in PHS based photoresists.

2. Background Description

Manufacturing of semiconductor devices is dependent upon the accurate replication of computer aided design (CAD) generated patterns onto the surface of a device substrate. The replication process is typically performed using lithographic processes followed by a variety of subtractive (etch) and additive (deposition) processes. Optical lithography patterning involves projecting an image of a pattern, reduced in size, onto a photosensitive film (photoresist or resist) on the device substrate. Other techniques may also be employed whereby radiant energy is projected onto the photoresist to effect relative changes (chemical or physical) between the exposed and unexposed portions of the photoresist material, such that portions of the photoresist material can be selectively removed to leave a desired photoresist pattern on the substrate surface. Negative tone photoresists are those types of resists wherein the portions of photoresist exposed to radiation remain on the substrate (e.g., chip, wafer, etc.) and the unexposed portions are removed from the substrate by developer. Positive tone photoresists perform oppositely, whereby the exposed portions are removed by developer, and the unexposed portions remain on the substrate.

Chemically amplified photoresists based on PHS are a class of photoresist that are patterned by using radiant energy to selectively activate a photo-acid compound dispersed within the polymer resin, whereby the photo-acid compound generates an acid which acts locally to either cause crosslinking of polymer chains by initiating crosslinking between the chains with a crosslinking agent distributed within the resin, or by removing acid labile moieties bonded to the phenolic hydroxy moities of the PHS polymer. Chemical amplification of photoresist materials are described in detail in U.S. Pat. No. 5,252,435 to Tani et al., U.S. Pat. No. 5,258,257 to Sinta et al., U.S. Pat. No. 5,352,564 to Takeda et al., and U.S. Pat. No. 5,210,000 to Thackery et al., all of which are herein incorporated by reference.

Chemically amplified negative tone photoresists have the inherent advantages of thermal stability and very high photospeeds. This allows for higher stepper thoughput and can eliminate the need for ultraviolet (UV) hardening.

Recently, researchers have been investigating the possibility of using chemically amplified negative tone photoresists in lithography applications having sub-micron resolution requirements (see, for example, U.S. Pat. No. 5,296,332 to Sachdev et al., which is herein incorporated by reference). Thackery et al., Proc. SPIE, 2195:152 (1994) describes a phenomenon described as "microbridging" which occurs with PHS based resins. Microbridging is the spontaneous formation of insoluble residues in unexposed regions. Thus, upon development, resist may remain between nested arrays or in other areas where it should have been removed. These fine bridges between high resolution resist patterns will adversely impact on the ability to precisely pattern the substrates. Microbridging is a problem only in sub-micron lithography applications (e.g., when the resolution requirements are on the order of 1–3 μm, microbridging is not a significant problem, but when the resolution requirements on the order of 0.2–0.5 μm, microbridging becomes an important problem).

Resist formulations based on novolak resins do not form microbridges. However, novolak resins are not viable resin canditates for high performance chemically amplified negative tone resists. Novolaks do not produce vertical profiles, as is required in high resolution lithography. In addition, Novolaks have too slow a dissolution rate in 2.38 wt % trimethyl ammonium hydroxide (TMAH), which is now the industry standard developer. Furthermore, the thermal stability of novolaks is significantly less than PHS (e.g., 130° C. vs. 200° C.).

Thackery et al., Proc. SPIE, 2195:152 (1994), demonstrated that microbridging problems could be reduced, but not eliminated, by using low molecular weight (e.g., <3800 daltons) PHS and 1.2 wt % TMAH developer. However, the approach of Thackery et al. is not well suited for industrial applications. Specifically, it does not allow using PHS having a wide range of molecular weights, thus, it places significant restrictions on the manufacture of the photoresist composition. In addition, 1.2% TMAH is a 50% reduction from the industry standard aqueous developer of 2.38% TMAH, hence, additional formulation and processing requirements are placed on the manufacturer. Furthermore, the use of a lower concentration of TMAH will increase the time required for development, and may increase the total volume of developer required if a spray operation is used for development. Both effects will increase the cost of producing the patterned substrates. Moreover, the Thackery et al. method was not completely effective and did not allow the production of lines which are less than 0.35 μm wide via I-line procedures.

SUMMARY OF THE INVENTION

It is an object of this invention to provide an improved chemically amplified negative tone photoresist based on PHS which allows reliable, sub-micron patterning without microbridge formation.

It is another object of this invention to provide a composition compatible with large scale integrated circuit manufacturing requirements which employs a PHS photoresist in sub-micron lithography applications.

According to the invention, using at least 10% of a copolymer of PHS and an acrylic polymer, such as poly(methyl methacrylate) (PMMA), in combination with PHS eliminates microbridge formation problems in chemically amplified photoresists based on PHS. The molecular weights of the polymers in the blend (e.g., PHS and copolymer of PHS and PMMA) can vary widely (2,000 to 50,000 daltons), and the resin system can be developed using the industry standard developer 2.38% TMAH. These photoresists can be reliably used in sub-micron lithography applications.

DETAILED DESCRIPTION OF A PREFERRED EMBODIMENT OF THE INVENTION

The generation of submicron size images in PHS based negative resists has found microbridging to occur with 2.38% TMAH Developer. In view of this, it has been determined that microbridging can be minimized in PHS based chemically amplified negative tone photoresists by adjusting the reactivity of the resins. This is accomplished by blending a co-polymer of PHS and an acrylic polymer, such as PMMA, together with PHS. Using fourier transform infrared (FTIR), it was observed that there is significant hydrogen bonding between the methacrylate and the hydroxy-styrene units in the co-polymer. This is evidenced by the carbonyl stretching peak in the spectrum. This hydrogen bonding of the phenolic moiety results in a decrease in the availability of sims for cross-linking. By reducing the number of available sites for cross-linking, the cross-linking threshold can be raised which, in turn, reduces the susceptibility of the resin to form microbridges.

Experiments have demonstrated that the co-polymer of PHS and the acrylic polymer should constitute at least 10% by weight of the polymer blend with PHS in order to formulate a high thermal stability negative tone photoresist which also has high resolution capabilities and is compatible with 2.38 wt % TMAH developer. Higher concentrations of co-polymer in the blend (e.g. 20 to 60%) are preferred. When the concentration of the co-polymer is less than 10%, microbridging problems arise due to the fact that less cross-linking sims are blocked by hydrogen bonding.

Within the co-polymer backbone, the PHS should constitute 10–90 wt % and the acrylic polymer should constitute 90–10 wt %. These ratios assure that an optimum amount of hydrogen bonding is achieved.

The acrylic polymers which can be used in the co-polymer are wide ranging and include all polymers formed from the vinyl sub-unit $CH_2=CR_1C(O)OR_2$ where $R_1$ and $R_2$ is a hydrogen, halogen or alkyl group (e.g., $C_{1-12}$ alkyl group). Best results have been achieved when the copolymer includes PHS and PMMA. Examples of other suitable acrylic polymers that may comprise a portion of the co-polymer include poly(acrylate), poly(methylacrylate), poly(ethylacrylate), poly(propylacrylate), poly(isopropylacrytate), poly(n-butylacrylate), poly(sec-butylacrylate), poly(isobutylacrylate), poly(tert-butylacrylate), poly(hexylacrylate), poly(heptylacrylate), poly(2-heptylacrylate), poly(2-ethylhexylacrylate), poly(2-ethylbutylacrylate), poly(dodecylacrylate), poly(ethyl methylacrylate), poly(m-ethyl ethylacrylate), poly(methyl propylacrylate), etc. The experiments discussed below were conducted with PHS and PHS:PMMA co-polymer combinations; however, it should be understood that other PHS:acrylic polymer co-polymer combinations can be used in a similar manner within the practice of this invention.

Experiments have demonstrated that sub-micron patterning can be reliably achieved with PHS and PHS:PMMA co-polymer blends when polymers of wide ranging molecular weights are used. Within the practice of this invention, both the PHS and the PHS:PMMA co-polymer can have molecular weights ranging from 2,000 to 50,000 daltons. Thus, the invention does not restrict the molecular weight of the polymer constituents.

The blend of PHS and PHS:acrylic polymer co-polymer (e.g., PHS:PMMA) will be used in a photoresist composition which includes a solvent, a photo-acid initiator, and a cross-linking agent. Each of these components are well known in the art and there selection and use can be varied considerably within the practice of this invention. Examples of each of these additional consituents which can be used within the practice of this invention can be found in the patent documents which have been incorporated by reference.

Glycol ether and glycol ether acetate solvents such as 2-methoxyethyl ether (diglyme), ethylene glycol monomethyl ether, propylene glycol monomethyl ether, and propylene glycol mono ether acetate (PGMEA), as well as other high boiling point ether and ether acetate solvents are expected to be the preferred within the practice of this invention, and their polar character aids in solubilizing the polymer blend. Co-solvents such as anisole and methoxy propanol can also be employed in combination with the solvents. Best results have been achieved with PGMEA in combination with anisole.

The solvent will preferably comprise a majority of the photoresist composition (e.g., 60–93% by weight), with the remainder being comprised of the PHS and PHS:acrylic co-polymer polymer blend, the acid generating compound, the crosslinking agent, and other additives deemed desirable (e.g., stabilizers; dyes; adhesion promoters; solubility modifiers; other resins; and materials to improve chemical resistance, flexibility, etch resistance, electrical properties, coating characteristics, exposure speed, development and resolution characteristics, etc.). However, it should be understood that the amount of solvent can vary considerably (e.g., 1–99% by weight) within the practice of this invention. Good results have been achieved when the solvent comprises 60–93% by weight of the photoresist composition, and the PHS and PHS:acrylic copolymer polymer blend (e.g., PHS and, PHS:PMMA) comprises 18–55% by weight of solids of the photoresist composition.

The acid generating compound, or "photoacid compound", used in the photoresist composition used in the practice of the present invention can be any of a variety of compounds that can generate an acid upon exposure to light energy, such as nitrobenzyl compounds, onium salts, sulfonic acid compounds, and carbonic acid compounds. Particularly good results can be achieved using triphenylsulfonium triflate and n-sulfonyloxyimides. Examples of photoacid generators are discussed at length in the patents incorporated by reference, and particularly in U.S. Pat. No. 5,258,257 to Sinta et al. The photoacid generator will be selected to respond to the radiation used for patterning the photoresist. Photoacid generators are currently available for a variety of different wavelengths from visible to X-ray; thus, imaging of the photoresist can be performed using deep UV, E-beam, laser, or any other activating radiation deemed useful. The photoacid generator will preferably comprise 0.01–10% by weight of the photoresist composition, and most preferably less than 2% by weight of the photoresist composition.

The crosslinking agent is selectively activated by the acid produced when the acid generating compound is exposed to photo-initiating radiation. The crosslinking agent will react, via condensation reaction, with phenolic hydroxy moieties on adjacent polymer chains in the photoresist to produce a cross-linked, hardened product which forms a negative tone image of the radiation pattern. The crosslinking agent used in the practice of this invention can be any of a variety of compounds including methoylated p-cresols, diacetoxycresols, and methoylated glycol urils. Suitable crosslinking agents are discussed in U.S. Pat. No. 5,296,332 to Sachdev et al. which is herein incorporated by reference. Particularly good results have been obtained with 2,6-dimethoyl-p-cresol.

While the invention has been described in terms of a single preferred embodiment, those skilled in the art will recognize that the invention can be practiced with modification within the spirit and scope of the appended claims.

We claim:

1. A radiation sensitive chemically amplified negative tone photoresist composition, comprising:
   a polymer blend having at least 10% by weight of a co-polymer of hydroxystyrene units and acrylic units, and up to 90% by weight of poly(hydroxystyrene);
   an acid generating compound which forms an acid upon exposure to radiation; and
   a crosslinking agent which is activatable by said acid formed from said acid generating compound.

2. The composition of claim 1 wherein said crosslinking agent is selected to condense with phenolic hydroxy moieties on polymers in said polymer blend.

3. The composition of claim 2 wherein said crosslinking agent is selected from the group consisting of methoylated cresols, diacetoxycresols, and hydroxymethylated glycourils.

4. The composition of claim 3 wherein said crosslinking agent is 2,6-dimethoyl-p-cresol.

5. The composition of claim 1 wherein said acid generating compound is activatable by radiation in the ultraviolet spectrum.

6. The composition of claim 1 wherein said acid generating compound is selected from the group consisting of onium salts, sulfonate esters, and n-sulfonyloxyimide.

7. The composition of claim 1 wherein said co-polymer of hydroxystyrene units and said acrylic units is comprised of 10–90% by weight of hydroxystyrene units and 90–10% by weight of methyl methacrylate units.

8. The composition of claim 1 wherein both said poly(hydroxystyrene) and said copolymer of hydroxystyrene units and said acrylic units each have a molecular weight ranging from 2,000 to 50,000 Daltons.

9. The composition of claim 1 further comprising a solvent, said polymer blend, said acid generating compound, and said crosslinking agent being dissolved or dispersed in said solvent, said polymer blend being present in said solvent in a sufficient quantity to form a film on a substrate, said acid generating compound being present in said solvent in sufficient quantity to activate said crosslinking agent, and said crosslinking agent being present in said solvent in sufficient quantity to crosslink polymers in said polymer blend.

10. The composition of claim 9 wherein said solvent includes at least one constituent selected from the group consisting of glycol ethers and glycol ether acetates.

11. The composition of claim 9 wherein said constituent is propylene glycol monomethyl ether acetate.

12. The composition of claim 9 wherein said polymer blend is 5 to 30% by weight, said acid generating compound is 1 to 5% by weight, said crosslinking agent is 1 to 5% by weight, and said solvent is 93 to 60% by weight.

13. The composition of claim 1 wherein said acrylic units in said copolymer of hydroxy styrene and said acrylic units are methylmethacrylate units.

14. A radiation sensitive chemically amplified negative tone photoresist composition, comprising:
   a polymer blend having at least 10% by weight of a co-polymer comprised of 10–90% by weight of hydroxystyrene units and 90–10% by weight of methylmethacrylate units, and up to 90% by weight of poly(hydroxystyrene);
   an acid generating compound which forms an acid upon exposure to radiation in the ultraviolet spectrum; and
   a crosslinking agent which is activatable by said acid formed from said acid generating compound, wherein said crosslinking agent is selected to condense with phenolic hydroxy moieties on polymers in said polymer blend.

15. The method of claim 14 wherein said crosslinking agent is selected from the group consisting of methoylated cresols, diacetoxycresols, and hydroxymethylated glycourils 16. The composition of claim 14 wherein said acid generating compound is selected from the group consisting of onium salts, sulfonated esters, and n-sulfonyloxyimide.

17. The composition of claim 14 wherein both said poly(hydroxystyrene) and said copolymer have a molecular weight ranging from 2,000 to 50,000 daltons.

* * * * *